United States Patent
Deepak et al.

(10) Patent No.: US 11,424,134 B2
(45) Date of Patent: Aug. 23, 2022

(54) ATOMIC LAYER ETCHING OF METALS

(71) Applicant: Applied Materials, Inc., Santa Clara, CA (US)

(72) Inventors: Nitin Deepak, Mumbai (IN); Prerna Sonthalia Goradia, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 16 days.

(21) Appl. No.: 17/005,284

(22) Filed: Aug. 27, 2020

(65) Prior Publication Data
US 2021/0090897 A1    Mar. 25, 2021

(30) Foreign Application Priority Data
Sep. 19, 2019 (IN) .............................. 201941037780

(51) Int. Cl.
| | |
|---|---|
| *H01L 21/3213* | (2006.01) |
| *H01L 21/768* | (2006.01) |
| *H01L 21/3065* | (2006.01) |
| *H01L 21/3105* | (2006.01) |
| *H01L 21/306* | (2006.01) |
| *H01L 21/322* | (2006.01) |

(52) U.S. Cl.
CPC .. *H01L 21/32136* (2013.01); *H01L 21/30604* (2013.01); *H01L 21/30655* (2013.01); *H01L 21/31056* (2013.01); *H01L 21/322* (2013.01); *H01L 21/76886* (2013.01)

(58) Field of Classification Search
None
See application file for complete search history.

(56) References Cited

U.S. PATENT DOCUMENTS

| | | | |
|---|---|---|---|
| 5,221,366 A | 6/1993 | Roberts et al. | |
| 5,782,986 A | 7/1998 | Butterbaugh et al. | |
| 6,010,603 A | * 1/2000 | Ye | C23F 4/00 |
| | | | 204/192.35 |
| 10,381,227 B2 | 8/2019 | George et al. | |

(Continued)

FOREIGN PATENT DOCUMENTS

EP    1052689 A1    11/2000

OTHER PUBLICATIONS

International Search Report and Written Opinion dated Dec. 18, 2020 for Application No. PCT/US2020/048987.

(Continued)

*Primary Examiner* — Stephanie P Duclair
(74) *Attorney, Agent, or Firm* — Patterson + Sheridan LLP

(57) ABSTRACT

The present disclosure generally relates to methods for selectively etching copper, cobalt, and/or aluminum layers on a substrate semiconductor manufacturing applications. A substrate comprising one or more copper layers, cobalt layers, or aluminum layers is transferred to a processing chamber. The surface of the copper, cobalt, or aluminum layer is oxidized. The oxidized copper, cobalt, or aluminum surface is then exposed to hexafluoroacetylacetonate vapor. The hexafluoroacetylacetonate vapor reacts with the oxidized copper, cobalt, or aluminum surface to form a volatile compound, which is then pumped out of the chamber. The reaction of the oxidized copper, cobalt, or aluminum surface with the hexafluoroacetylacetonate vapor selectively atomic layer etches the copper, cobalt, or aluminum surface.

17 Claims, 4 Drawing Sheets

(56) References Cited

U.S. PATENT DOCUMENTS

| | | | |
|---|---|---|---|
| 2001/0009154 A1 | 7/2001 | Nguyen et al. | |
| 2015/0280114 A1* | 10/2015 | Shen | H01L 21/02554 |
| | | | 438/3 |
| 2016/0060767 A1* | 3/2016 | Omstead | H01L 21/32134 |
| | | | 216/62 |
| 2017/0032990 A1* | 2/2017 | Lin | H01L 21/32136 |
| 2018/0138054 A1* | 5/2018 | Romero | H01L 21/76802 |
| 2018/0327913 A1* | 11/2018 | Lansalot-Matras | |
| | | | H01L 21/67069 |

OTHER PUBLICATIONS

Mohimi et al. "Thermal Atomic Layer Etching of Copper by Sequential Steps Involving Oxidation and Exposure to Hexafluoroacetylacetone," ECS Journal of Solid State Science and Technology, vol. 7, No. 9, pp. P491-P495, 2018, DOI: 10.1149/2.0211809jss.

* cited by examiner

ATOMIC LAYER ETCHING OF METALS

CROSS-REFERENCE TO RELATED APPLICATIONS

This application claims benefit of Indian provisional patent application serial number 201941037780, filed Sep. 19, 2019, which is herein incorporated by reference.

BACKGROUND

Field

Embodiments of the present disclosure generally relate to methods for selectively etching copper, cobalt, and/or aluminum layers on a substrate for semiconductor manufacturing applications.

Description of the Related Art

Reliably producing sub-half micron and smaller features are one of the key technology challenges for next generation very large-scale integration (VLSI) and ultra-large-scale integration (ULSI) of semiconductor devices. However, as the limits of circuit technology are pushed, the shrinking dimensions of VLSI and ULSI technology have placed additional demands on processing capabilities. As circuit densities increase for next generation devices, the widths of interconnects, such as vias, trenches, contacts, gate structures and other features, as well as the dielectric materials therebetween, decrease to 45 nm and 32 nm dimensions and beyond, whereas the thickness of the dielectric layers remains substantially constant, with the result of increasing the aspect ratios of the features.

When forming these features, such interconnection structures in a film stack disposed on a substrate, a wet etch process or ion-etching process is often utilized. Wet-chemical etch processes are not preferred, whereas ion-etching methods can leave the etched surface rough. Additionally, conventional etchants have low selectivity to etch one material over another material present in the structure, which may result in a fragile substrate becoming damaged when etching interconnection structures.

Therefore, there is a need in the art for an improved method of etching interconnection structures without damaging the substrate.

SUMMARY

The present disclosure generally relates to methods for selectively etching copper, cobalt, and/or aluminum layers on a substrate semiconductor manufacturing applications. A substrate comprising one or more copper layers, cobalt layers, or aluminum layers is transferred to a processing chamber. The surface of the copper, cobalt, or aluminum layer is oxidized. The oxidized copper, cobalt, or aluminum surface is then exposed to hexafluoroacetylacetonate vapor. The hexafluoroacetylacetonate vapor reacts with the oxidized copper, cobalt, or aluminum surface to form a volatile compound, which is then pumped out of the chamber. The reaction of the oxidized copper, cobalt, or aluminum surface with the hexafluoroacetylacetonate vapor selectively atomic layer etches the copper, cobalt, or aluminum surface.

In one embodiment, a method of etching a first layer comprises oxidizing a first surface of a first layer in a process chamber, exposing the oxidized first surface of the first layer to hexafluoroacetylacetonate vapor at a temperature of about 100° C. to about 300° C. to form a volatile compound, and pumping the volatile compound out of the process chamber.

In another embodiment, a method of etching a copper layer comprises oxidizing a surface of a copper layer in a process chamber, exposing the oxidized surface of the copper layer to hexafluoroacetylacetonate vapor to form a copper(II) hexafluoroacetylacetonate compound, and pumping the copper(II) hexafluoroacetylacetonate compound out of the process chamber.

In yet another embodiment, a method of etching a cobalt layer comprises oxidizing a surface of a cobalt layer in a process chamber, exposing the oxidized surface of the cobalt layer to hexafluoroacetylacetonate vapor to form a cobalt(II) hexafluoroacetylacetonate compound, and pumping the cobalt(II) hexafluoroacetylacetonate compound out of the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods for selectively etching copper, cobalt and/or aluminum layers on a substrate semiconductor manufacturing applications. A substrate comprising one or more copper layers, cobalt layers, or aluminum layers is transferred to a processing chamber. The surface of the copper, cobalt, or aluminum layer is oxidized. The oxidized copper, cobalt, or aluminum surface is then exposed to hexafluoroacetylacetonate vapor. The hexafluoroacetylacetonate vapor reacts with the oxidized copper, cobalt, or aluminum surface to form a volatile compound, which is then pumped out of the chamber. The reaction of the oxidized copper, cobalt, or aluminum surface with the hexafluoroacetylacetonate vapor selectively atomic layer etches the copper, cobalt, or aluminum surface.

Figure 1:
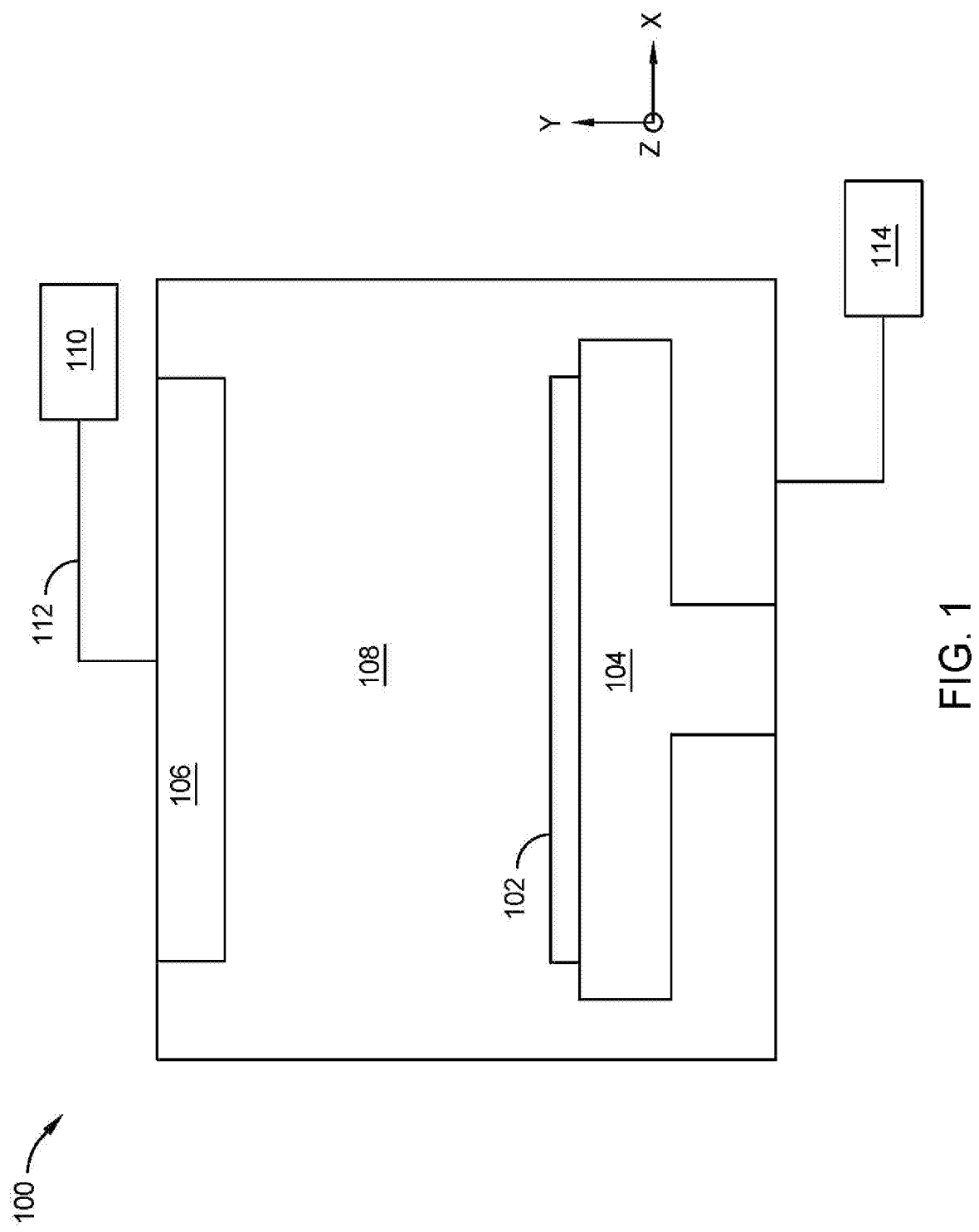
FIG. 1 illustrates an exemplary process chamber utilized for atomic layer etching layers on a substrate, according to one embodiment.

FIG. 1 illustrates an exemplary process chamber 100 utilized for atomic layer etching (ALE) layers on a substrate 102, according to one embodiment. The processing chamber 100 comprises a process volume 108. A substrate support 104 for supporting a substrate 102 and a showerhead 106 are disposed in the process volume 108. The showerhead 106 may be a heated showerhead. The showerhead 106 is coupled to a gas source 110 through one or more supply lines 112. The gas source 110 and supply lines 112 deliver gases to the showerhead 106, which the showerhead 106 then disperses into the process volume 108 to process the substrate 102. The showerhead 106 may be used to heat the substrate 102, and to disperse compounds to the surface of the substrate, such as oxidizing agents, vapors, and plasmas.

The substrate support 104 is coupled to a vacuum pump 114. The vacuum pump 114 is configured to pump gases out of the process volume 108 to remove the gases from the processing chamber 100. The substrate support 104 may be connected to an actuator (not shown) to move the substrate support 104. For example, the substrate support 104 may be configured to raise or lower in the z-direction to move closer to the showerhead 106. The process chamber 100 may comprise several other elements or components not shown or described here. As such, the processing chamber 100 is not intended to be limiting.

FIGS. 2A-2D illustrates a schematic of atomic layer etching a first layer 204 disposed on a substrate 202 in a process chamber 200 comprising a heated showerhead 206, according to one embodiment. The process chamber 200 may be the process chamber 100 of FIG. 1. The first layer 204 may comprise copper, cobalt, or aluminum. In one embodiment, the substrate 202 comprises $SiO_2$ or SiN. FIGS. 2A-2D will be described in FIGS. 3 and 4 below.

Figure 3:
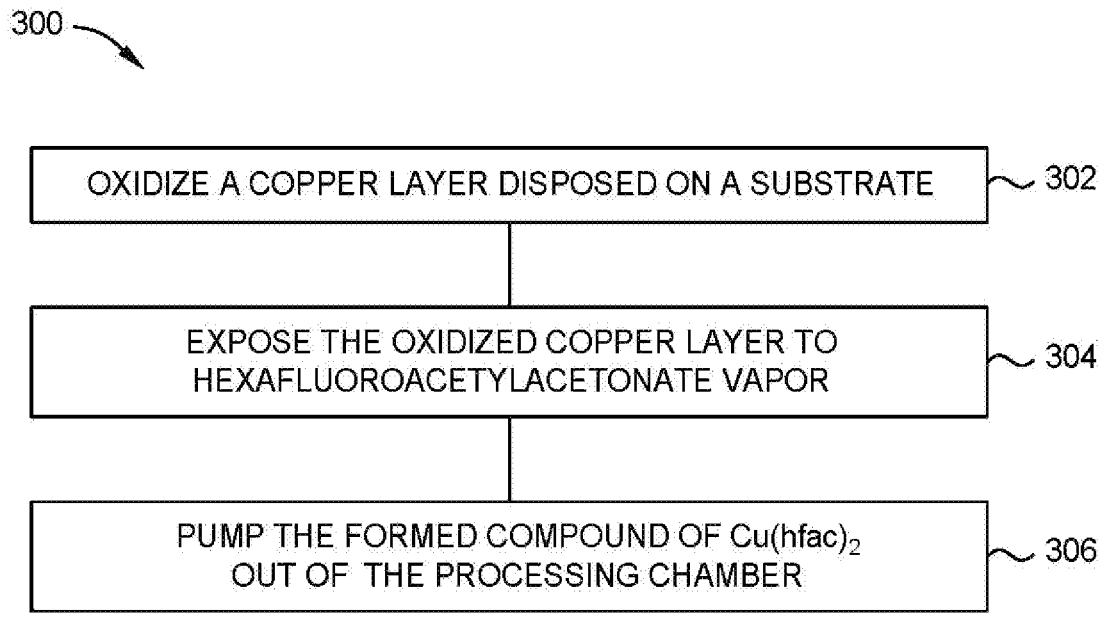
FIG. 3 illustrates a method of atomic layer etching a copper layer disposed on the substrate, according to one embodiment.

FIG. 3 illustrates a method 300 of atomic layer etching the first layer 204 disposed on the substrate 202, where the first layer 204 is a copper (Cu) layer, according to one embodiment. While copper is used as the first layer 204 in FIG. 3, the first layer 204 may be another metal, such as aluminum. The substrate 202 is first transferred to the processing chamber 200. The substrate 202 may be transferred to the processing chamber 200 already having the copper layer 204 deposited on the substrate 202, or the copper layer 204 may be deposited on the substrate within the processing chamber 200.

Figure 2A:
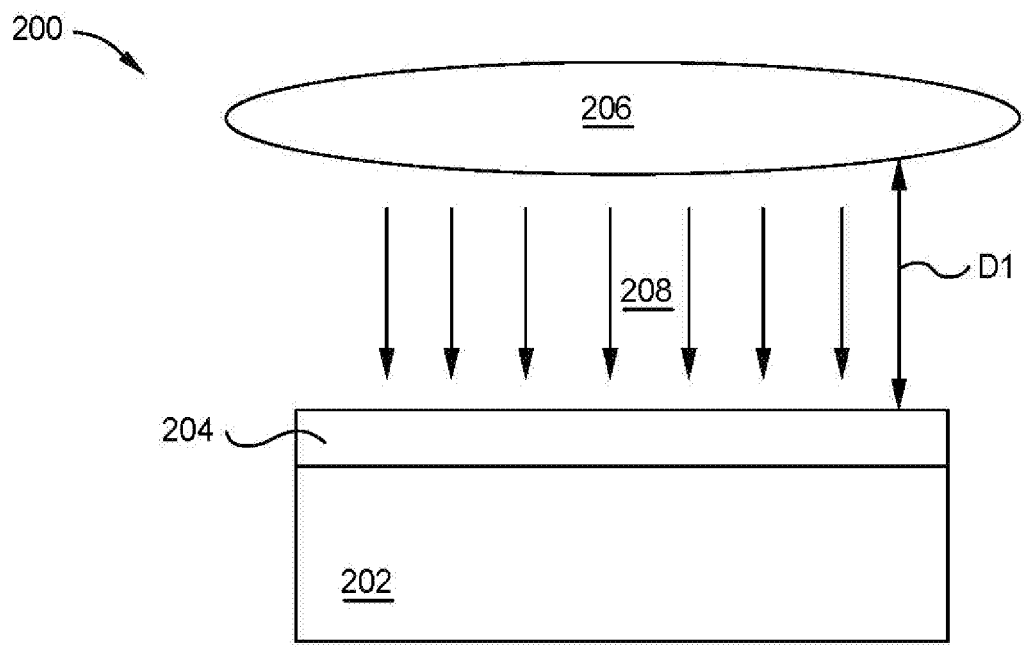
FIGS. 2A-2D illustrates a schematic of atomic layer etching a first layer disposed on a substrate in a process chamber comprising a showerhead, according to one embodiment.

In operation 302, the copper layer 204 disposed on the substrate 202 is oxidized using an oxidizing agent 208, or oxidizer, as shown in FIG. 2A. The substrate 202 comprising the copper layer 204 is spaced a first distance D1 from the showerhead 206. The oxidizing agent 208 may comprise $O_3$, $O_2$, $O_2$ plasma, or water. In one embodiment, the copper layer 204 may be directionally oxidized using oxygen ions and an electrical bias of low energy, such as a voltage of about 20 V to about 30 V, resulting in an ion energy of about 10 eV to about 20 eV, and a discharge current in the order of several tens of amperes to give a high ion density. The discharge current may be tuned to change the oxidation rate. In such an embodiment, the oxidization of the copper layer 204 may be more selective, as only the portions of the copper layer 204 exposed to oxygen ions or radicals may get oxidized. Additionally, using the directionality of oxygen ions and masking the areas where etching is not required can provide directional oxidation selectivity. For example, if the copper layer 204 is disposed in a via or hole, only the bottom of the via or hole may be oxidized while the sidewalls of the via or hole remain un-oxidized.

By oxidizing the copper layer 204, the oxidized portions 210 of the copper layer form copper(I) oxide (i.e., cuprous oxide) ($Cu_2O$) or copper(II) oxide (i.e., cupric oxide) (2CuO), based on the first chemical equation:

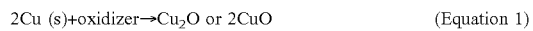

2Cu (s)+oxidizer→$Cu_2O$ or 2CuO     (Equation 1)

Figure 2B:
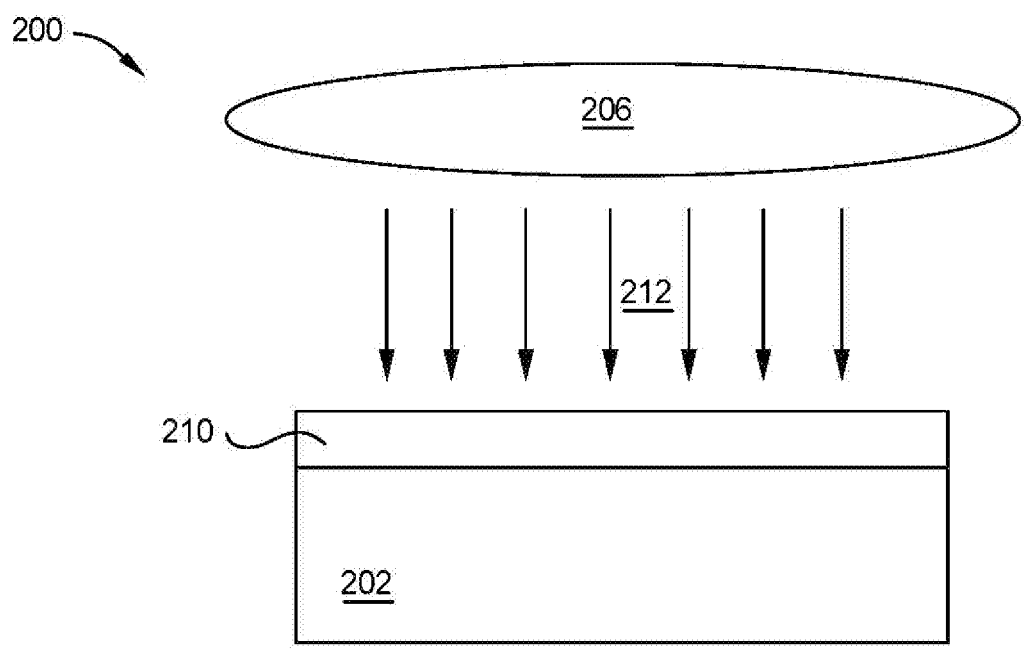
Figure 2C:
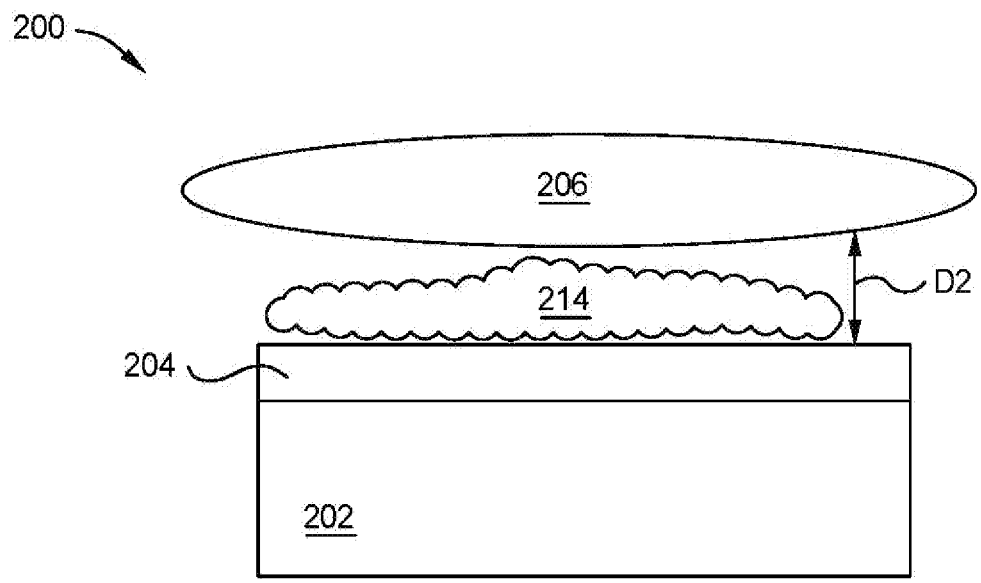

In operation 304, the oxidized portions 210 of the copper layer 204 are exposed to hexafluoroacetylacetonate (H(hfac)) vapor 212, as shown in FIG. 2B. In one embodiment, the oxidized portions 210 of the copper layer 204 may be exposed to H(hfac) 212 at a temperature of about 100° C. to about 300° C., or the oxidized portions 210 of the copper layer 204 may first be exposed to H(hfac) 212 and then subsequently heated (shown in FIG. 2C). In such an embodiment, to heat the oxidized portions 210 of the copper layer 204, the substrate 202 may be brought closer to a heated showerhead 206, as shown in FIG. 2C, such that the substrate 202 is spaced a second distance D2 less than the first distance D1 from the showerhead 206.

Figure 2D:
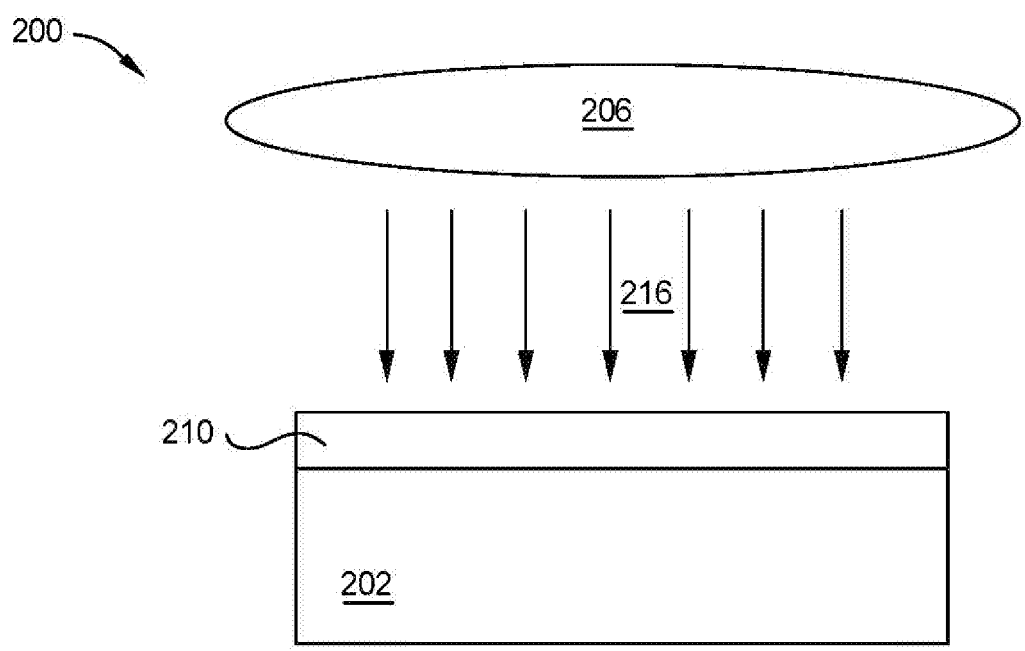

In another embodiment, the oxidized portions 210 of the copper layer 204 exposed to the H(hfac) vapor 212 are bombarded with directional argon (Ar+) ions 216 at a low ion energy, such as about 10 eV to about 20 eV, and a discharge current in the order of several tens of amperes to give a high ion density, as shown in FIG. 2D. The bombardment of Ar+ ions 216 can occur between cryogenic to room-temperature (i.e., below the boiling point of $Cu(hfac)_2$), rather than heating the oxidized portions 210 of the copper layer 204 like described in FIG. 2C.

Exposing the oxidized portions 210 of the copper layer 204 to H(hfac) 212 forms a volatile compound, $Cu(hfac)_2$ 214, which comprises hfac and the etched oxidized copper of the copper layer 204. H(hfac) replaces oxygen on the surface of the copper layer 204 with hfac and forms $Cu(hfac)_2$ 214. Thus, only the oxidized portions 210 of the copper layer 204 are etched, and any underlying metallic layers are not etched. The chemical reaction of the exposure of the oxidized portions 210 of the copper layer 204 to H(hfac) is shown in the second (starting with $Cu_2O$) or third (starting with CuO) chemical equations:

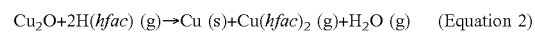

$Cu_2O+2H(hfac)$ (g)→Cu (s)+$Cu(hfac)_2$ (g)+$H_2O$ (g)     (Equation 2)

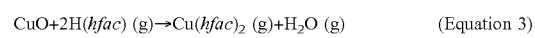

CuO+2H(hfac) (g)→$Cu(hfac)_2$ (g)+$H_2O$ (g)     (Equation 3)

When the oxidized portions 210 of the copper layer 204 are heated, as discussed in FIG. 2C, the volatile compound of $Cu(hfac)_2$ 214 leaves the surface of the substrate 202, as the volatile compound is in a gaseous state. Similarly, when the $Cu(hfac)_2$ 214 is bombarded with directional Ar+ ions 216 at a temperature below the boiling temperature of $Cu(hfac)_2$, as shown in FIG. 2D, the bombardment of Ar+ ions 216 breaks the bonds of the top surface of the $Cu(hfac)_2$ 214, causing the volatile compound of $Cu(hfac)_2$ to leave the surface of the substrate 202. Once the volatile compound leaves the surface of the substrate 202, un-etched portions of the copper layer 204 may remain.

In operation 306, the formed compound of $Cu(hfac)_2$ is pumped out of the processing chamber 200. Method 300 may be repeated one or more times to selectively etch copper layers in a layer-by-layer manner, providing a greater amount of control. While H(hfac) is used to form the volatile copper compound, other organic vapors may be used, such as 1,1,1,3,3,3-hexafluoro-2-propanol, hexafluoro-tert-butoxide acetyl acetone, and tetra-fluoropropanol. As such, H(hfac) is used as an example, and is not intended to be limiting.

Figure 4:
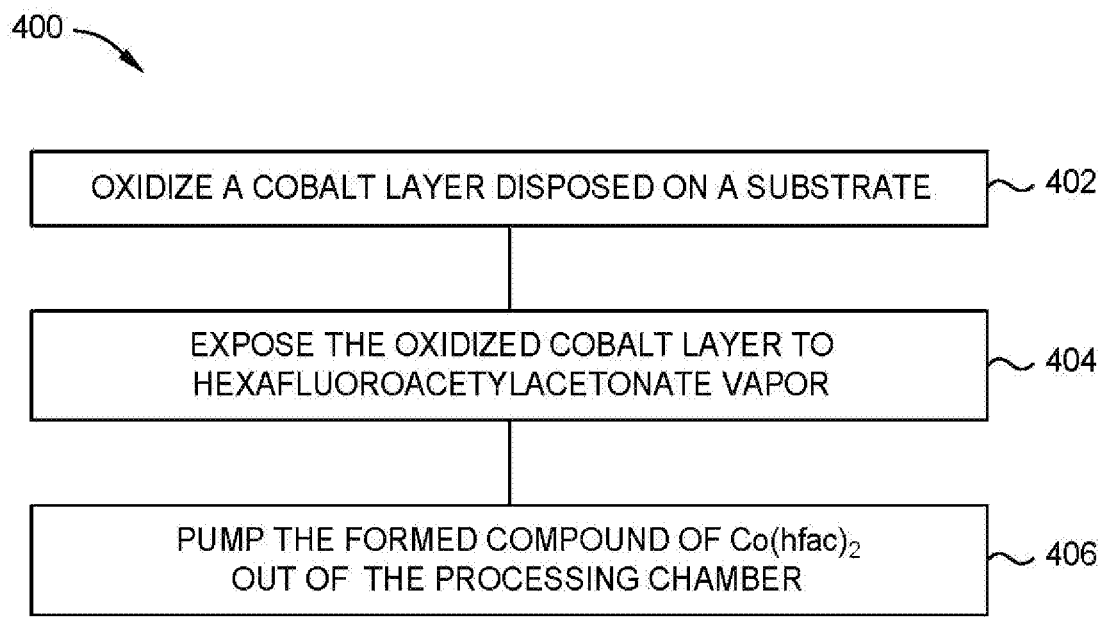
FIG. 4 illustrates a method of atomic layer etching a cobalt layer disposed on the substrate, according to one embodiment.

FIG. 4 illustrates a method 400 of atomic layer etching the first layer 204 disposed on the substrate 202, where the first layer 204 is a cobalt (Co) layer, according to another embodiment. While cobalt is used as the first layer 204 in FIG. 4, the first layer 204 may be another metal, such as aluminum. The substrate 202 is first transferred to the processing chamber 200. The substrate 202 may be transferred to the processing chamber 200 already having the cobalt layer 204 deposited on the substrate 202, or the cobalt layer 204 may be deposited on the substrate within the processing chamber 200.

In operation 402, the cobalt layer 204 disposed on a substrate 202 is oxidized using an oxidizing agent 208, or oxidizer, as shown in FIG. 2A. The substrate 202 comprising the cobalt layer 204 is spaced a first distance D1 from the showerhead 206. The oxidizing agent 208 may comprise $O_3$, $O_2$, $O_2$ plasma, or water. In one embodiment, the cobalt layer 204 may be directionally oxidized using oxygen ions and an electrical bias of low energy, such as about, such as a voltage of about 20 V to about 30 V, resulting in an ion energy of about 10 eV to about 20 eV, and a discharge current in the order of several tens of amperes to give a high ion density. The discharge current may be tuned to change the oxidation rate. In such an embodiment, the oxidization of the cobalt layer 204 may be more selective, as only the portions of the cobalt layer 204 exposed to oxygen ions or radicals may get oxidized. Additionally, using the directionality of oxygen ions and masking the areas where etching is not required can provide directional oxidation selectivity. For example, if the cobalt layer 204 is disposed in a via or hole, only the bottom of the via or hole may be oxidized while the sidewalls of the via or hole remain un-oxidized.

By oxidizing the cobalt layer 204, the oxidized portions 210 of the cobalt layer 204 forms cobalt oxide (CoO), based on the fourth chemical equation:

$$2\ Co\ (s) + oxidizer \rightarrow 2CoO \qquad \text{(Equation 4)}$$

In operation 404, the oxidized portions 210 of the cobalt layer 204 are exposed to H(hfac) vapor 212, as shown in FIG. 2B. In one embodiment, the oxidized portions 210 of the cobalt layer 204 may be exposed to H(hfac) 212 at a temperature of about 100° C. to about 300° C., or the oxidized portions 210 of the cobalt layer 204 may first be exposed to H(hfac) 212 and then subsequently heated (shown in FIG. 2C). In such an embodiment, to heat the oxidized portions 210 of the cobalt layer 204, the substrate 202 may be brought closer to a heated showerhead 206, as shown in FIG. 2C, such that the substrate 202 is spaced a second distance D2 less than the first distance D1 from the showerhead 206.

In another embodiment, the oxidized portions 210 of the cobalt layer 204 exposed to the H(hfac) vapor 212 are bombarded with directional argon (Ar+) ions 216 at a low ion energy, such as about 10 eV to about 20 eV, and a discharge current in the order of several tens of amperes to give a high ion density, as shown in FIG. 2D. The bombardment of Ar+ ions 216 can occur between cryogenic to room-temperature (i.e., below the boiling point of Co(hfac)$_2$), rather than heating the oxidized portions 210 of the cobalt layer 204 like described in FIG. 2C.

Exposing the oxidized portions 210 of the cobalt layer 204 to H(hfac) 212 forms a volatile compound, Co(hfac)$_2$ 214, which comprises hfac and the etched oxidized cobalt of the cobalt layer 204. H(hfac) replaces oxygen on the surface of the cobalt layer 204 with hfac and forms Co(hfac)$_2$ 214. Thus, only the oxidized portions 210 of the cobalt layer 204 are etched, and any underlying metallic layers are not etched. The chemical reaction of the exposure of the oxidized portions 210 of the cobalt layer 204 to H(hfac) is shown in the fifth chemical equation:

$$CoO + 2H(hfac)\ (g) \rightarrow Co(hfac)_2\ (g) + H_2O\ (g) \qquad \text{(Equation 5)}$$

When the oxidized portions 210 of the cobalt layer 204 are heated, as discussed in FIG. 2C, the volatile compound of Co(hfac)$_2$ 214 leaves the surface of the substrate 202, as the volatile compound is in a gaseous state. Similarly, when the Co(hfac)$_2$ 214 is bombarded with directional Ar+ ions 216 at a temperature below the boiling temperature of Co(hfac)$_2$, as shown in FIG. 2D, the bombardment of Ar+ ions 216 breaks the bonds of the top surface of the Co(hfac)$_2$ 214, causing the volatile compound of Co(hfac)$_2$ to leave the surface of the substrate 202. Once the volatile compound leaves the surface of the substrate 202, un-etched portions of the cobalt layer 204 may remain.

In operation 406, the formed compound of Co(hfac)$_2$ is pumped out of the processing chamber 200. Method 400 may be repeated one or more times to selectively etch cobalt layers in a layer-by-layer manner, providing a greater amount of control. While H(hfac) is used to form the volatile copper compound, other organic vapors may be used, such as 1,1,1,3,3,3-hexafluoro-2-propanol, hexafluoro-tert-butoxide acetyl acetone, and tetra-fluoropropanol. As such, H(hfac) is used as an example, and is not intended to be limiting.

While FIG. 3 illustrates etching of copper and FIG. 4 illustrates etching of cobalt, other metals may be etched using the same process, such as aluminum. Thus, the examples of copper and cobalt are not intended to be limiting.

By first oxidizing a copper, cobalt, or aluminum layer and then exposing the oxidizing copper, cobalt, or aluminum layer to H(hfac) vapor, the copper, cobalt, or aluminum layer can be selectively atomic layer etched in an easy and effective manner without increasing the surface roughness of the etched surface. Additionally, the methods of etching the copper, cobalt, or aluminum layer described herein enable the etching of the copper, cobalt, or aluminum to be self-limiting, as only the oxidized copper, cobalt, or aluminum is etched, providing greater amount of control compared to conventional methods.

In one embodiment, a method of etching a first layer comprises oxidizing a first surface of a first layer in a process chamber, exposing the oxidized first surface of the first layer to hexafluoroacetylacetonate vapor at a temperature of about 100° C. to about 300° C. to form a volatile compound, and pumping the volatile compound out of the process chamber. The first surface is directionally oxidized using oxygen ions and an electrical bias of low energy. The first layer comprises copper, cobalt, or aluminum, the oxidizing the first surface and exposing the oxidized first surface layer to hexafluoroacetylacetonate etches the first layer, and only the oxidized first surface of the first layer is etched to expose a second surface of the first layer. The method further comprises oxidizing the second surface of the first layer, exposing the oxidized second surface of the first layer to hexafluoroacetylacetonate vapor at a temperature of about 100° C. to about 300° C. to form the volatile compound, and pumping the volatile compound out of the process chamber.

In another embodiment, a method of etching a copper layer comprises oxidizing a surface of a copper layer in a process chamber, exposing the oxidized surface of the copper layer to hexafluoroacetylacetonate vapor to form a copper(II) hexafluoroacetylacetonate compound, and pumping the copper(II) hexafluoroacetylacetonate compound out of the process chamber.

An oxidizing agent selected from the group consisting of water, ozone, oxygen, and oxygen plasma is used to oxidize the copper layer. Oxidizing the surface of the copper layer forms copper(I) oxide or copper (II) oxide. The oxidizing the copper layer and exposing the oxidized surface of the copper layer to hexafluoroacetylacetonate etches the surface of the copper layer. Only the oxidized surface of the copper layer

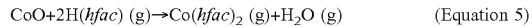

is etched. The oxidizing the copper layer and exposing the oxidized surface of the copper layer to hexafluoroacetylacetonate forms water, the water being in a gaseous form, and the water is pumped out of the process chamber. The method further comprises bombarding the copper(II) hexafluoroacetylacetonate hydrate compound with argon ions at low energy. Exposing the oxidized surface of the copper layer to hexafluoroacetylacetonate vapor is performed at a temperature of about 100° C. to about 300° C.

In yet another embodiment, a method of etching a cobalt layer comprises oxidizing a surface of a cobalt layer in a process chamber, exposing the oxidized surface of the cobalt layer to hexafluoroacetylacetonate vapor to form a cobalt(II) hexafluoroacetylacetonate compound, and pumping the cobalt(II) hexafluoroacetylacetonate compound out of the process chamber.

An oxidizing agent selected from the group consisting of water, ozone, oxygen, and oxygen plasma is used to oxidize the cobalt layer. Oxidizing the surface of the cobalt layer forms cobalt oxide. The oxidizing the cobalt layer and exposing the oxidized surface of the cobalt layer to hexafluoroacetylacetonate etches the surface of the cobalt layer. Only the oxidized surface of the cobalt layer is etched. The oxidizing the cobalt layer and exposing the oxidized surface of the cobalt layer to hexafluoroacetylacetonate forms water, the water being in a gaseous form, and the water is pumped out of the process chamber. The method further comprises bombarding the cobalt hexafluoroacetylacetonate hydrate compound with argon ions at low energy. Exposing the oxidized surface of the cobalt layer to hexafluoroacetylacetonate vapor is performed at a temperature of about 100° C. to about 300° C.

While the foregoing is directed to embodiments of the present disclosure, other and further embodiments of the disclosure may be devised without departing from the basic scope thereof, and the scope thereof is determined by the claims that follow.

What is claimed is:

1. A method of etching a first layer, comprising:
   positioning a substrate on a substrate support in a process chamber;
   oxidizing a first surface of a first layer on the substrate during a first time period when the substrate is on the substrate support, wherein oxidizing the first surface comprises oxidizing the first layer only to a depth of an atomic layer of the first layer;
   exposing the oxidized first surface of the first layer to hexafluoroacetylacetonate vapor at a temperature of about 100° C. to about 300° C. to form a volatile compound during a second time period when the substrate is on the substrate support, wherein the second time period begins after the first time period ends;
   heating the substrate during the second time period to raise a temperature of the substrate during the second time period compared to a temperature of the substrate during the first time period, wherein the heat during the second time period is provided by a heated showerhead in the process chamber; and
   pumping the volatile compound out of the process chamber.

2. The method of claim 1, wherein the first surface is directionally oxidized using oxygen ions and an electrical bias of low energy.

3. The method of claim 1, wherein the first layer comprises copper, cobalt, or aluminum, wherein the oxidizing the first surface and exposing the oxidized first surface layer to hexafluoroacetylacetonate etches an atomic layer of the first layer to expose a second surface of the first layer.

4. The method of claim 3, further comprising:
   oxidizing the second surface of the first layer during a third time period when the substrate is on the substrate support, wherein oxidizing the second surface comprises oxidizing the first layer only to a depth of an atomic layer of the first layer and the third time period occurs after the second time period ends;
   exposing the oxidized second surface of the first layer to hexafluoroacetylacetonate vapor at a temperature of about 100° C. to about 300° C. to form the volatile compound during a fourth time period when the substrate is on the substrate support, wherein the fourth time period begins after the third time period ends; and
   pumping the volatile compound out of the process chamber.

5. The method of claim 1, wherein the substrate is heated during the second time period by moving the substrate to a closer distance to the heated showerhead in the process chamber during the second time period than a distance between the substrate and the heated showerhead during the first time period.

6. A method of etching a copper layer, comprising:
   positioning a substrate on a substrate support in a process chamber;
   oxidizing a surface of a copper layer on the substrate during a first time period when the substrate is on the substrate support, wherein oxidizing the surface comprises oxidizing the copper layer only to a depth of an atomic layer of the copper layer;
   exposing the oxidized surface of the copper layer to hexafluoroacetylacetonate vapor to form a copper(II) hexafluoroacetylacetonate compound during a second time period when the substrate is on the substrate support, wherein the second time period begins after the first time period ends;
   heating the substrate during the second time period to raise a temperature of the substrate during the second time period compared to a temperature of the substrate during the first time period, wherein the heat during the second time period is provided by a heated showerhead in the process chamber; and
   pumping the copper(II) hexafluoroacetylacetonate compound out of the process chamber.

7. The method of claim 6, wherein an oxidizing agent selected from the group consisting of water, ozone, oxygen, and oxygen plasma is used to oxidize the copper layer.

8. The method of claim 7, wherein oxidizing the surface of the copper layer forms copper(I) oxide or copper (II) oxide.

9. The method of claim 8, wherein the oxidizing the copper layer and exposing the oxidized surface of the copper layer to hexafluoroacetylacetonate etches an atomic layer of the copper layer.

10. The method of claim 6, further comprising bombarding the copper(II) hexafluoroacetylacetonate compound with argon ions at a low energy.

11. The method of claim 6, wherein exposing the oxidized surface of the copper layer to hexafluoroacetylacetonate vapor is performed at a temperature of about 100° C. to about 300° C.

12. The method of claim 6, wherein the substrate is heated during the second time period by moving the substrate to a closer distance to the heated showerhead in the process chamber during the second time period than a distance between the substrate and the heated showerhead during the first time period.

13. A method of etching a cobalt layer, comprising:
    positioning a substrate on a substrate support in a process chamber;
    oxidizing a surface of a cobalt layer on the substrate during a first time period when the substrate is on the substrate support, wherein oxidizing the surface comprises oxidizing the cobalt layer only to a depth of an atomic layer of the cobalt layer;
    exposing the oxidized surface of the cobalt layer to hexafluoroacetylacetonate vapor to form a cobalt(II) hexafluoroacetylacetonate compound during a second time period when the substrate is on the substrate support, wherein the second time period begins after the first time period ends;
    heating the substrate during the second time period to raise a temperature of the substrate during the second time period compared to a temperature of the substrate during the first time period, wherein the heat during the second time period is provided by a heated showerhead in the process chamber; and
    pumping the cobalt(II) hexafluoroacetylacetonate compound out of the process chamber.

14. The method of claim 13, wherein an oxidizing agent selected from the group consisting of water, ozone, oxygen, and oxygen plasma is used to oxidize the cobalt layer.

15. The method of claim 13, further comprising bombarding the cobalt(II) hexafluoroacetylacetonate compound with argon ions at a low energy.

16. The method of claim 13, wherein exposing the oxidized surface of the cobalt layer to hexafluoroacetylacetonate vapor is performed at a temperature of about 100° C. to about 300° C.

17. The method of claim 13, wherein the substrate is heated during the second time period by moving the substrate to a closer distance to the heated showerhead in the process chamber during the second time period than a distance between the substrate and the heated showerhead during the first time period.

* * * * *